US009030108B2

(12) United States Patent
Deak, Sr. et al.

(10) Patent No.: US 9,030,108 B2
(45) Date of Patent: May 12, 2015

(54) GAUSSIAN SURFACE LENS QUANTUM PHOTON CONVERTER AND METHODS OF CONTROLLING LED COLOUR AND INTENSITY

(76) Inventors: David Deak, Sr., Nesconset, NY (US); David Deak, Jr., Nesconset, NY (US)

( * ) Notice: Subject to any disclaimer, the term of this patent is extended or adjusted under 35 U.S.C. 154(b) by 43 days.

(21) Appl. No.: 13/465,604

(22) Filed: May 7, 2012

(65) Prior Publication Data

US 2013/0293123 A1 Nov. 7, 2013

(51) Int. Cl.
*H01L 37/00* (2006.01)
*H01L 25/04* (2014.01)
H01L 51/56 (2006.01)

(52) U.S. Cl.
CPC ............... *H01L 25/048* (2013.01); *H01L 51/56* (2013.01)

(58) Field of Classification Search
CPC ............... H01L 25/048; H01L 2924/09701; H01L 31/028; H01L 31/03044; H01L 33/32; H01L 51/52; H01L 51/56
USPC ............ 257/17, 98; 313/512; 315/158; 705/26.1; 136/255; 362/231
See application file for complete search history.

(56) References Cited

U.S. PATENT DOCUMENTS

| | | | | |
|---|---|---|---|---|
| 7,402,832 B2* | 7/2008 | Lee | | 257/17 |
| 2003/0038596 A1* | 2/2003 | Ho | | 313/512 |
| 2006/0018118 A1* | 1/2006 | Lee et al. | | 362/231 |
| 2008/0110494 A1* | 5/2008 | Reddy | | 136/255 |
| 2011/0012096 A1* | 1/2011 | Carmeli et al. | | 257/40 |
| 2011/0055037 A1* | 3/2011 | Hayashigawa et al. | | 705/26.1 |
| 2011/0133237 A1* | 6/2011 | Koike et al. | | 257/98 |
| 2011/0227487 A1* | 9/2011 | Nichol et al. | | 315/158 |
| 2012/0199929 A1* | 8/2012 | Kamijyo et al. | | 257/432 |

* cited by examiner

*Primary Examiner* — Kenneth Parker
*Assistant Examiner* — Bo Fan

(57) ABSTRACT

This invention is a photon-interactive Gaussian surface lens method means that converts incident photons from a single or a plurality of wide band gap semiconductor class light emitting diode dies, into a secondary emission of photons emanating from a composite photon transparent colloidal stationary suspension of quantum dots, high efficiency phosphors, a combination of quantum dots and high efficiency phosphors and nano-particles of metal, silicon or similar semiconductors from the IIIB and IVB Group of the Periodic Table and any nano-material and/or micro/nano spheres that responds to Rayleigh Scattering and/or Mie Scattering; and a plurality of quantum dots in communication with said nano-particles in said suspension. The apparatus and methods according to the present invention provides in improved narrow pass-band of red, green, and blue photon efficiency over phosphor based conversion. Utilizing the invention's methodology, the white resultant color temperature is stabilized against internal semiconductor thermal fluctuations or ambient thermal variations.

5 Claims, 13 Drawing Sheets

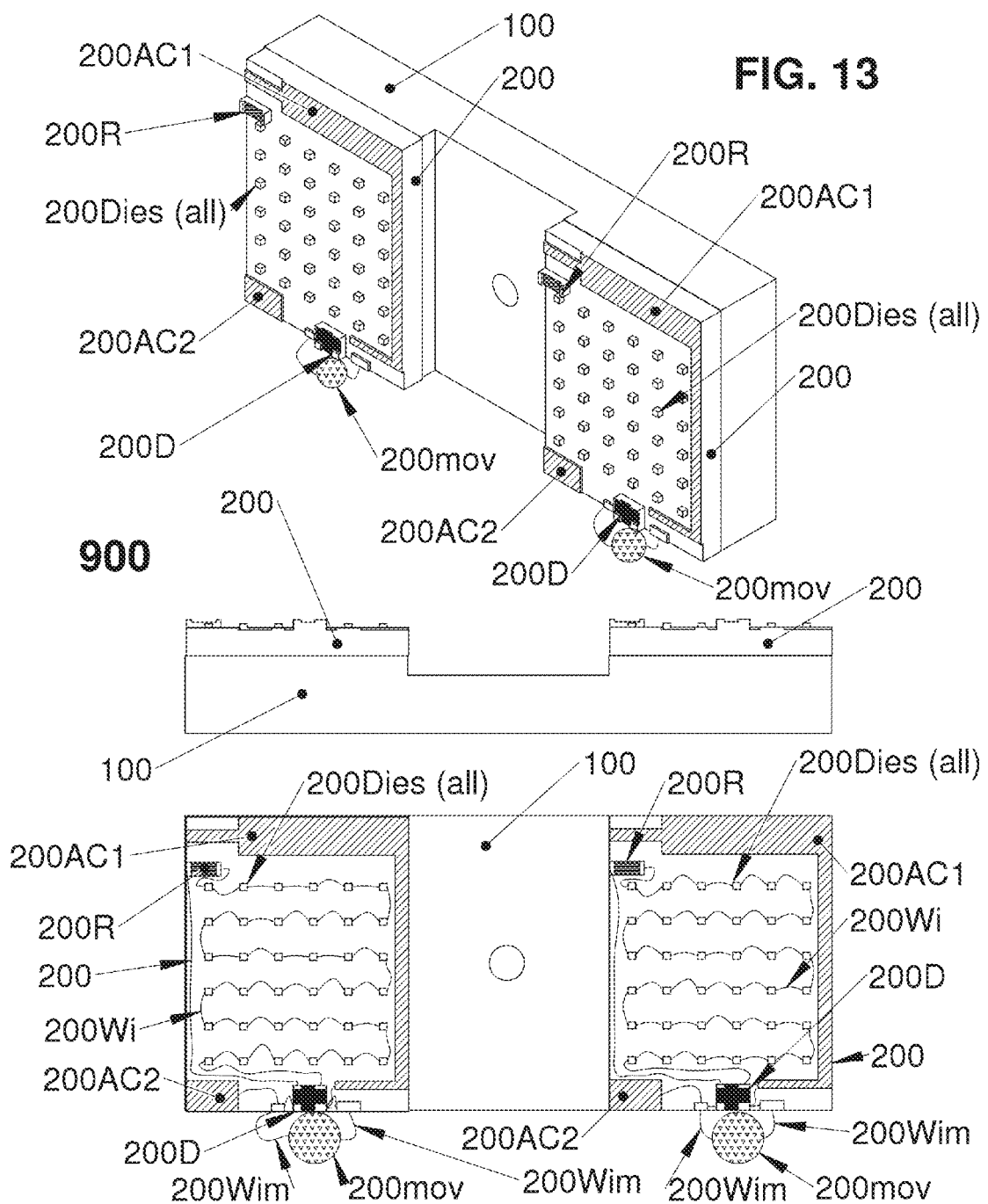

GAUSSIAN SURFACE LENS QUANTUM PHOTON CONVERTER AND METHODS OF CONTROLLING LED COLOUR AND INTENSITY

FIELD OF THE INVENTION

The present invention relates to the emission methods of light emitting diodes and how intrinsic recombination semiconductor photons (i.e. 450 nanometer) eminent with wide band gap semiconductors designed for use as light emitting diodes, are converted by quantum secondary emission of high efficiency phosphors, to a usable range of white light. One of the problems with conventional phosphor methods is with gradual white colour temperature degradation due to ambient thermal fluctuations.

Within the next five years, it is likely that white light emitting diodes (WLEDs) will be used for all interior and external lighting functions, from homes, industry and even vehicles. Because of such wide scale potential use, WLEDs have attracted both scientific attention and commercial interest. Different approaches for white light generation such as multi-chip WLEDs, monolithic WLEDs and colour-conversion WLEDs have been extensively investigated. Among these, multi-chip white LEDs (and monolithic WLEDs, in principle, for the same matter) tend to exhibit higher electrical-to-light conversion efficiencies when compared with colour-conversion WLEDs, for the multi-chip WLEDs do not have additional energy losses caused by the Stokes shift and non-radiative recombination, unlike in the phosphor coating of colour-conversion WLEDs. Additionally, multi-chip WLEDs do not suffer ageing problems related to the phosphor, which affects the lifetime of colour-conversion WLEDs. However, for multi-chip WLEDs, the driving electric circuit is typically comparatively complex for general illumination purposes, leading to increased costs. As a result, the colour-conversion approach provides an advantage specifically in having simple circuits (and thus reduced cost) when compared to the multi-chip WLED approach.

Today, using the colour-conversion technique, phosphor based WLEDs have been widely commercialized and are currently in use. In phosphor-based colour conversion, however, difficulties in controlling granule size systematically, and mixing and depositing films uniformly pose the most fundamental disadvantages, which result in undesired visible colour variations.

As an alternative approach, quantum dots have recently been used for colour conversion in white light generation.

The novelty of the present invention teaches that there are other method means of producing white light utilizing quantum dots and/or high efficiency phosphors, in combination with micro/nano spheres and nano-particles of metal, silicon or similar semiconductor material from the IIIB and IVB Group of the Periodic Table in a photon transparent colloidal stationary suspension media means. The present invention also teaches that white-light LED devices based on single size, ultra-small cadmium selenide (CdSe) quantum dots that possess broadband emission (420-710 nm). When encapsulated in a polymer and coated on commercial UV LEDs, these quantum dots act as frequency down converters to produce high quality white light. These devices emit very pure white light with excellent CIE coordinates 0.35, 0.31) and a very high color rendering index of 93 when excited with a 365 nm LED.

What is utilized is a plurality of components in a GAUSSIAN SURFACE LENS QUANTUM PHOTON CONVERTER to increase the extraction efficiency and decrease UV light leakage from the device. This increases extraction efficiency by reflecting emitted white light out of the device that would normally be lost. Second, the tradeoff of color quality and efficiency that results from using blue LEDs for excitation: unabsorbed blue light will imbalance the white-light spectrum, but the conversion of blue to white light yields a lower Stokes loss than UV excitation light.

BACKGROUND OF THE INVENTION

The evolution of wide band gap semiconductors such as InGaAs and InGaN for utilization in high brightness white or single colour light emitting diodes has advanced with prior art focusing in areas of improved yield rate (binning), improvements in thermal removal appliques, and colour range stabilization; not to mention thermal effects on colour shift and light output efficiency. The focus on colour output by utilizing high photon output phosphors remains the industry standard for low forward current LED dies ($3 \times 10^2$ Amperes) and high forward current LED dies ($2.5 \times 10^1$ Amperes and greater). Current drawbacks are with thermal fluctuations over time with high efficiency phosphors and brightness output efficiency. Little or no attention, as indicated from the lack of prior art, has been paid to concept of optical lens systems being a more important issue than just placing a small quantity of phosphor over the LED die and covering it over with a small amount of transparent epoxy or polymer plastic. The present invention teaches that careful analysis of the action of photon conversion from the intrinsic 450 (average) nanometer photons propagating from the LED die-to-phosphor atoms are a result of Raman Scattering. Raman Scattering is inelastic and therefore total kinetic energy is not conserved, which results in the scattered photons not possessing the same frequency and wavelength as the incident photons from the a LED die. The conclusion is simply that the light output, as a result of this simple quantum mechanical process, is the combination of the secondary Raman scattered photons and the incident 450 nanometer photons from the LED die. This is the methodology means of producing white light, and the colour temperature range of this white light varies as to the chemical composition of the phosphor utilized. That remains the conclusion for the interest and investigation of the LED industry currently. There has been to date, across the board focus on increasing the lumens per watt by either refinement of the LED die selection by binning or by incorporating a plurality of LED dies in various cascoding, or cascading, or combinations of both. The present invention teaches that instead of Raman Scattering solely being responsible for the light output of fabricated LEDs currently; a novel combination approach utilizing Rayleigh Scattering, Mie Scattering, Stokes Scattering, quantum dots, nano-particles of metal, silicon or similar semiconductor material from the IIIB and IVB Group of the Periodic Table and micro or nano transparent spheres of glass or polymer plastic. This novel approach takes advantage of utilizing incident photons emitted from an LED die to excite said quantum dots that are tuned to a specific narrow pass-band; by definition quantum dots are semiconductors whose excitons are confined in all three spatial dimensions. Consequently, such materials have electronic properties intermediate between those of bulk semiconductors and those of discrete molecules. Quantum dot electronic characteristics are closely related to the size and shape of the individual crystal. Generally, the smaller the size of the crystal, the larger the band gap, the greater the difference in exit on energy between the highest valence band and the lowest conduction band becomes, therefore more energy is needed to excite the dot, and concurrently, more energy is released when the crystal returns to its resting state. For example, in fluorescent dye applications, this equates to higher frequencies of light emitted after excitation of the dot as the crystal size grows smaller, resulting in a color shift from red to blue in the light emitted. In addition to such tuning, a main advantage with quantum dots is that, because of the high level of control possible over the size of the crystals produced, it is possible to have very precise control over the conductive properties of the material. Quantum dots of different sizes can be assembled into a gradient multi-layer nano-film. Typical sizes of quantum dots range from 2 to 10 nm (1-50 atoms) in diameter, and by band gap engineering techniques can be finely tuned to a wide spectrum of individual narrow band gap Gaussian distribution curves for optimized photon output. With quantum dots in the range of 2 to 10 nm the highly tuned colour range of monochromatic photon release is well defined and stable with temperature variations and are much more efficient that phosphors by at least 30% increase, but an unusual phenomena occurs when the quantum dot becomes less than 1.7 nm in diameter.

Scattering is a general physical process where some forms of radiation, such as light, sound, or moving particles, are forced to deviate from a straight trajectory by one or more localized non-uniformities in the medium through which they pass. In conventional use, this also includes deviation of reflected radiation from the angle predicted by the law of reflection. Reflections that undergo scattering are often called diffuse reflections and unscattered reflections are called specular (mirror-like) reflections The types of non-uniformities that cause scattering, sometimes known as scatterers or scattering centers, are too numerous to list, but a small sample includes particles, bubbles, droplets, density fluctuations in fluids, crystallites in polycrystalline solids, defects in monocrystalline solids, surface roughness, cells in organisms, and textile fibers in clothing. The effects of such features on the path of almost any type of propagating wave or moving particle can be described in the framework of scattering theory.

Dominant areas where scattering and scattering theory are significant include radar sensing, medical ultrasound, semiconductor wafer inspection, polymerization process monitoring, acoustic tiling, free-space communications, and computer-generated imagery.

The types of scattering utilized with the present invention are Rayleigh Scattering, Mie Scattering, and Stokes Scattering.

Rayleigh Scattering

Rayleigh Scattering is the elastic scattering of light or other electromagnetic radiation by particles much smaller than the wavelength of the light. The particles may be individual atoms or molecules. It can occur when light travels through transparent solids and liquids. Rayleigh scattering is a function of the electric polarizability of the particles.

Rayleigh scattering of sunlight in the atmosphere causes diffuse sky radiation, which is the reason for the blue color of the sky and the yellow tone of the sun itself.

Scattering by particles similar to or larger than the wavelength of light is typically treated by the Mie theory, the discrete dipole approximation and other computational techniques. Rayleigh scattering applies to particles that are small with respect to wavelengths of light, and that are optically "soft" (i.e. with a refractive index close to 1). On the other hand, Anomalous Diffraction Theory applies to optically soft but larger particles.

The size of a scattering particle is parameterized by the ratio x (eq. 1) of its characteristic dimension r and wavelength λ:

$$X = \frac{2\pi r}{\lambda} \quad \text{eq. 1}$$

Rayleigh scattering can be defined as scattering in the small size parameter regime x<<1. Scattering from larger spherical particles is explained by the Mie theory for an arbitrary size parameter x. For small x the Mie theory reduces to the Rayleigh approximation.

The amount of Rayleigh scattering that occurs for a beam of light depends upon the size of the particles and the wavelength of the light. Specifically, the intensity of the scattered light varies as the sixth power of the particle size, and varies inversely with the fourth power of the wavelength.

The intensity I of light scattered by a single small particle from a beam of unpolarized light of wavelength λ and intensity $I_0$ is given by (eq. 2):

$$I = Io \frac{1 + \cos^2\theta}{2R^2} \left(\frac{2\pi}{\lambda}\right)^4 \left(\frac{n^2-1}{n^2+2}\right)^2 \left(\frac{d}{2}\right)^6 \quad \text{eq. 2}$$

where R is the distance to the particle, θ is the scattering angle, n is the refractive index of the particle, and d is the diameter of the particle.

$$\sigma = \frac{2\pi^5}{3} \frac{d^6}{\lambda^4} \left(\frac{n^2-1}{n^2+2}\right)^2 \quad \text{eq. 3}$$

The Rayleigh scattering coefficient (eq. 3) for a group of scattering particles is the number of particles per unit volume N times the cross-section. As with all wave effects, for incoherent scattering the scattered powers add arithmetically, while for coherent scattering, such as if the particles are very near each other, the fields add arithmetically and the sum must be squared to obtain the total scattered power.

Rayleigh scattering also occurs from individual molecules. Here the scattering is due to the molecular polarizability α, which describes how much the electrical charges on the molecule will move in an electric field. In this case, the Rayleigh scattering intensity for a single particle is given by (eq. 4)

$$Iscatt = Io \frac{8\pi^4 \alpha^2}{\lambda^4 r^2} (1 + \cos^2) \quad \text{eq. 4}$$

The amount of Rayleigh scattering from a single particle can also be expressed as a cross section σ. For example, the major constituent of the atmosphere, nitrogen, has a Rayleigh cross section of 5.1×10-31 $m^2$ at a wavelength of 532 nm (green light). This means that at atmospheric pressure, about a fraction $10^{-5}$ of light will be scattered for every meter of travel.

The strong wavelength dependence of the scattering (~$\lambda^{-4}$) means that shorter (blue) wavelengths are scattered more strongly than longer (red) wavelengths. This results in the indirect blue light coming from all regions of the sky. Rayleigh scattering is a good approximation of the manner in which light scattering occurs within various media for which scattering particles have a small size parameter.

Shorter wavelengths are scattered more intensely than longer wavelengths. This means that blue light has a higher probability of being scattered than red light.

This is the reason the sky appears to be blue. Sunlight, which is made up of a continuous spectrum of wavelengths, scatters from atmospheric particles. Since the particle size is much smaller than the wavelengths of light, the shorter wavelength blue light is scattered more intensely.

A portion of the light coming from the sun scatters off molecules and other small particles in the atmosphere. It is this scattered light that gives the sky its brightness and its color. As previously explained, Rayleigh scattering is inversely proportional to the fourth power of wavelength, so that shorter wavelength violet and blue light will scatter more than the longer wavelengths (yellow and especially red light). The resulting color, which appears like a pale blue, actually is a mixture of all the scattered colors, mainly blue and green. Violet, though strongly scattered, is a minor component of the solar spectrum and is less efficiently detected by the human eye. Conversely, glancing toward the sun, the colors that were not scattered away—the longer wavelengths such as red and yellow light—are directly visible, giving the sun itself a slightly yellowish hue. Viewed from outer space, however, the sky is black and the sun is white.

The reddening of sunlight is intensified when the sun is near the horizon, because the volume of air through which sunlight must pass is significantly greater than when the sun is high in the sky. The Rayleigh scattering effect is therefore increased, removing virtually all blue light from the direct path to the observer. The remaining unscattered light is mostly of a longer wavelength, and therefore appears to be orange.

Mie Scattering Versus Rayleigh Scattering

The scattering of light from larger particles is known as Mie Scattering; the Mie solution to Maxwell's equations (also known as the Lorenz-Mie solution, the Lorenz-Mie-Debye solution or Mie scattering) describes the scattering of electromagnetic radiation by a sphere. The solution takes the form of an analytical infinite series. The larger particles scatter the light in the forward direction. The larger a particle, the more intense the light scattered in the forward direction. Mie Scattering is not strongly wavelength dependent. It also produces a white glare around the particle. This is the reason fog or mist appears to be white and why the sky appears to be white near the horizon during a clear day.

Rayleigh scattering is strongly dependent upon the size of the particle and the wavelengths. The intensity of the Rayleigh scattered radiation increases rapidly as the ratio of particle size to wavelength increases. Furthermore, the intensity of Rayleigh scattered radiation is identical in the forward and reverse directions.

The Rayleigh scattering model breaks down when the particle size becomes larger than around 10% of the wavelength of the incident radiation. In the case of particles with dimensions greater than this, Mie's scattering model can be used to find the intensity of the scattered radiation. The intensity of Mie scattered radiation is given by the summation of an infinite series of terms rather than by a simple mathematical expression. It can be shown, however, that Mie scattering differs from Rayleigh scattering in several respects; it is roughly independent of wavelength and it is larger in the forward direction than in the reverse direction. The greater the particle size, the more of the light is scattered in the forward direction.

SUMMARY OF THE INVENTION

This present invention and novel improvement over prior art, relates to a plurality of novel embodiments for creating white light output or single colour light output with light emitting diodes by utilizing a novel permanent or removable GAUSSIAN SURFACE LENS QUANTUM PHOTON CONVERTER system means for efficient and enhanced photon conversion, disposed and in communication with a light emitting diode system means.

It is the intention of the present invention to teach through said plurality of novel embodiments that improves white light output efficiency or single colour light output efficiency in light emitting diodes, which are thermally stabilized and exist with a narrow pass-band of photon emission from quantum dots compared to conventional phosphors; resulting from utilizing the embodiments.

Another intention of the present invention is to utilize "heavy metal free" quantum dots, but not limited to "heavy metal free" quantum dots as a component of a plurality of components in a GAUSSIAN SURFACE LENS QUANTUM PHOTON CONVERTER.

It is another intention of the invention to utilize nano-particles of metal, silicon or similar semiconductor material from the IIIB and IVB Group of the Periodic Table, but not limited to said nano-particles of silicon or similar semiconductor material from the IIIB and IVB Group of the Periodic Table as a component that by Rayleigh Scattering, acts as a mirror or reflective optical antenna to scatter photons within the volume of the GAUSSIAN SURFACE LENS QUANTUM PHOTON CONVERTER.

It is another intention of the invention to utilize micro or nano transparent spheres of glass or polymer plastic a component that by Mie Scattering, acts as a mirror or reflective optical antenna to scatter photons within the volume of the GAUSSIAN SURFACE LENS QUANTUM PHOTON CONVERTER.

Another intention of the invention is for utilize a Gaussian curvilinear surface volume comprised of a photon transparent epoxy or polymer plastic embodiment that contains and is in communication with the quantum dots, nano-particles, and micro or nano spheres.

It is also the intention the present invention to have the photon transparent epoxy or polymer plastic embodiment mounted over the effective light emitted region of the light emitting diode assembly so that any and all incident photons released as a result of forward biasing the light emitting diode assembly, will travel throughout the photon transparent epoxy or polymer plastic embodiment for quantum interaction with the quantum dots, nano-particles, and nano/micro spheres to establish a designed white colour temperature expressed in degrees Kelvin or with a designed single colour temperature expressed in degrees Kelvin.

Further, another intention of the present invention is to utilize a plurality of varying sizes of quantum dots in order to create a white light emitting diode re-movable lens system means; and to utilize a plurality of single narrow band quantum dots to create a monochromatic light emitting diode removable lens system means.

Another novel intention of the present embodiment of said present invention is for the creation of a "white light" removable lens system means that utilizes a plurality of ultra small quantum dots of atomic diameters less than 2 nanometers;

and by their broadband emission (420-710 nm) throughout most of the visible light spectrum, while not suffering from self absorption, produce "white light" from a single size group of the ultra small quantum dots less than 2 nanometers in atomic diameter.

Further it is another intention of the present invention to utilize the GAUSSIAN SURFACE LENS QUANTUM PHOTON CONVERTER as a removable lens system method means to make available a plurality of changeable lens options during or after production of LEDs for purposes of changing the colour output of any light emitting diode simply by inserting a changeable and easily removable surface lens means.

BRIEF DESCRIPTION OF THE DRAWINGS

FIG. 13 An illustration of a DCOB (dual chip on board) LED array that has the capability of auto-detecting the difference in either 120 VAC or 240 VAC and instantly switching to that voltage mode for proper operation; with option of utilizing a remote and wireless transceiver colour and intensity control method means.

DETAILED DESCRIPTION OF THE PREFERRED EMBODIMENTS

Figure 1:
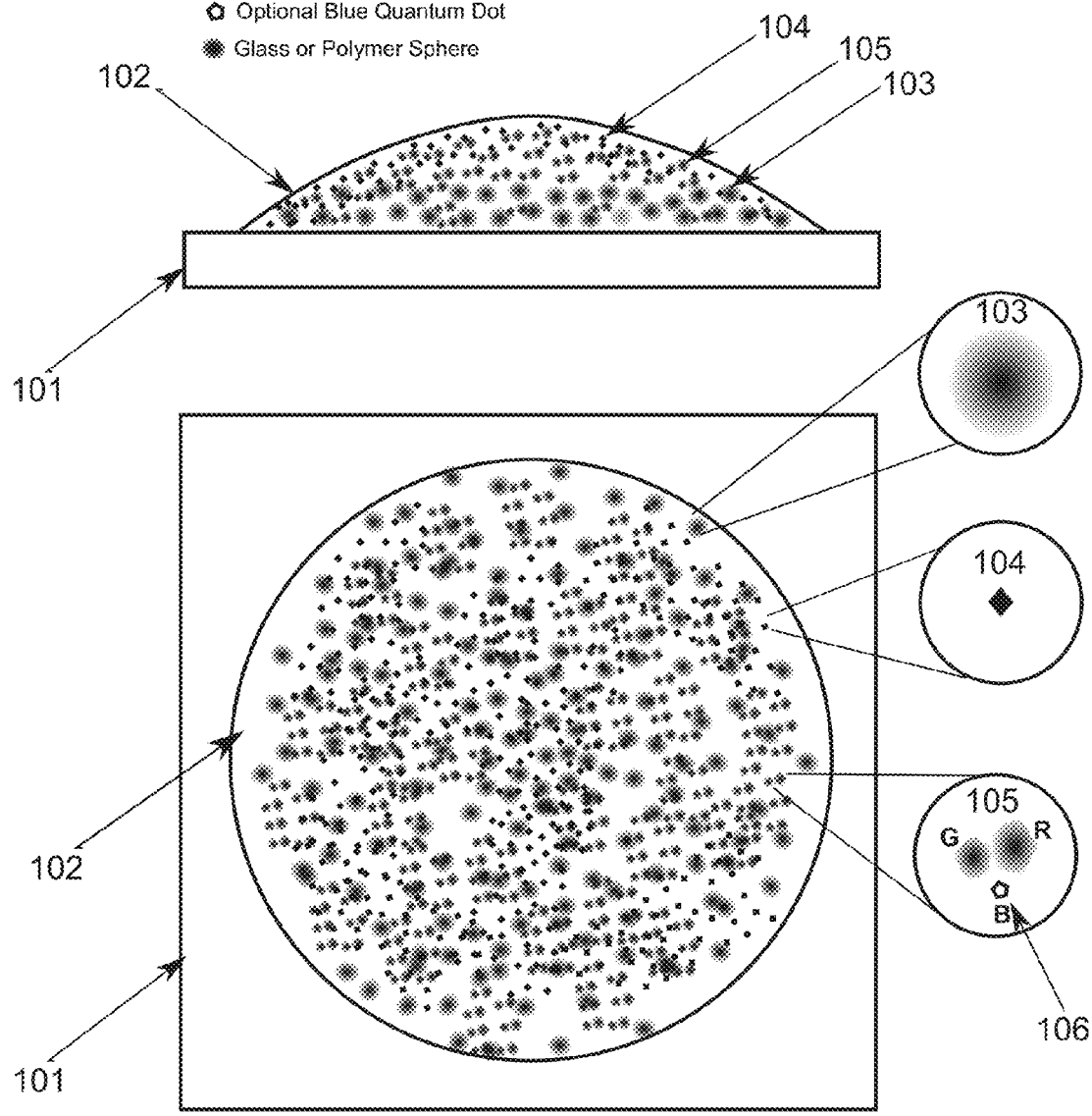
FIG. 1 is a side and top view of one embodiment of the photon converter lens containing; a stationary colloidal suspension of red & green quantum dots with blue quantum dots as an option depending on appliques, nano-particles, and glass or polymer spheres; or diamond dust particles.

With reference to FIG. 1 there is shown an embodiment 100 of a GAUSSIAN SURFACE LENS QUANTUM PHOTON CONVERTER 100 comprised of a photon transparent base substrate 101 in communication with a disposed curvi-linear (Gaussian) stationary suspension 102 comprised of a photon transparent polymer material, such as an epoxy that is comprised and contains within its stationary suspended form a plurality of the following components disposed and in communication with said stationary suspension; a plurality of quantum dots 105, a plurality of high efficiency phosphors, a combination of a plurality of quantum dots 105 and a plurality of high efficiency phosphors and a plurality of nano-particles 104 of metal, silicon or similar semiconductors from the IIIB and IVB Group of the Periodic Table and any nano-material and/or micro/nano spheres 103 that responds to Rayleigh Scattering and/or Mie Scattering; and a plurality of quantum dots in communication with the plurality of nano-particles 104 in said suspension and said micro spheres 103 in the suspension 102. Said stationary suspension of quantum dots 105 are a selected ratio of red 105R and green quantum dots 105G, and based upon design features selected for a specific selection ratio of red 105R to green 105G; and a plurality of blue quantum dots 106B are not limited from being added to said quantum dot suspension to aid in control of emitted "white" light for desired variations in colour temperature (degrees Kelvin). The quantum dot plurality 105 upon stimulation absorption of ultra-violet (~450 nm wavelength) photons emitted as incident light from a wide band gap LED (light emitting diode), such as InGaN or similar wide band gap semiconductor, have narrow pass band characteristics over a wide range of temperatures. This makes for a stable condition of maintaining colour temperature or the outcome of such action for producing a "white" LED.

Another embodiment of said present invention, and relating to FIG. 1, is for the creation of a monochromatic (single colour) LED; and when the quantum dot suspension is comprised of only red quantum dots 105R, the LED is classified as a Red LED; and when the quantum dot suspension 102 is comprised of only green quantum dots 105G, the LED is classified as a Green LED; and when the quantum dot suspension is comprised of only red quantum dots 105B, the LED is classified as a Blue LED. Further is should be obvious to anyone steeped in the art that quantum dots by their very nature, produce a narrow pass band of a specific light wavelength based upon their atomic size, and any plurality combination of different size quantum dots will produce a specific resultant quasi-monochromatic colour range from red, to orange, to yellow, to green, or to blue.

Figure 2:
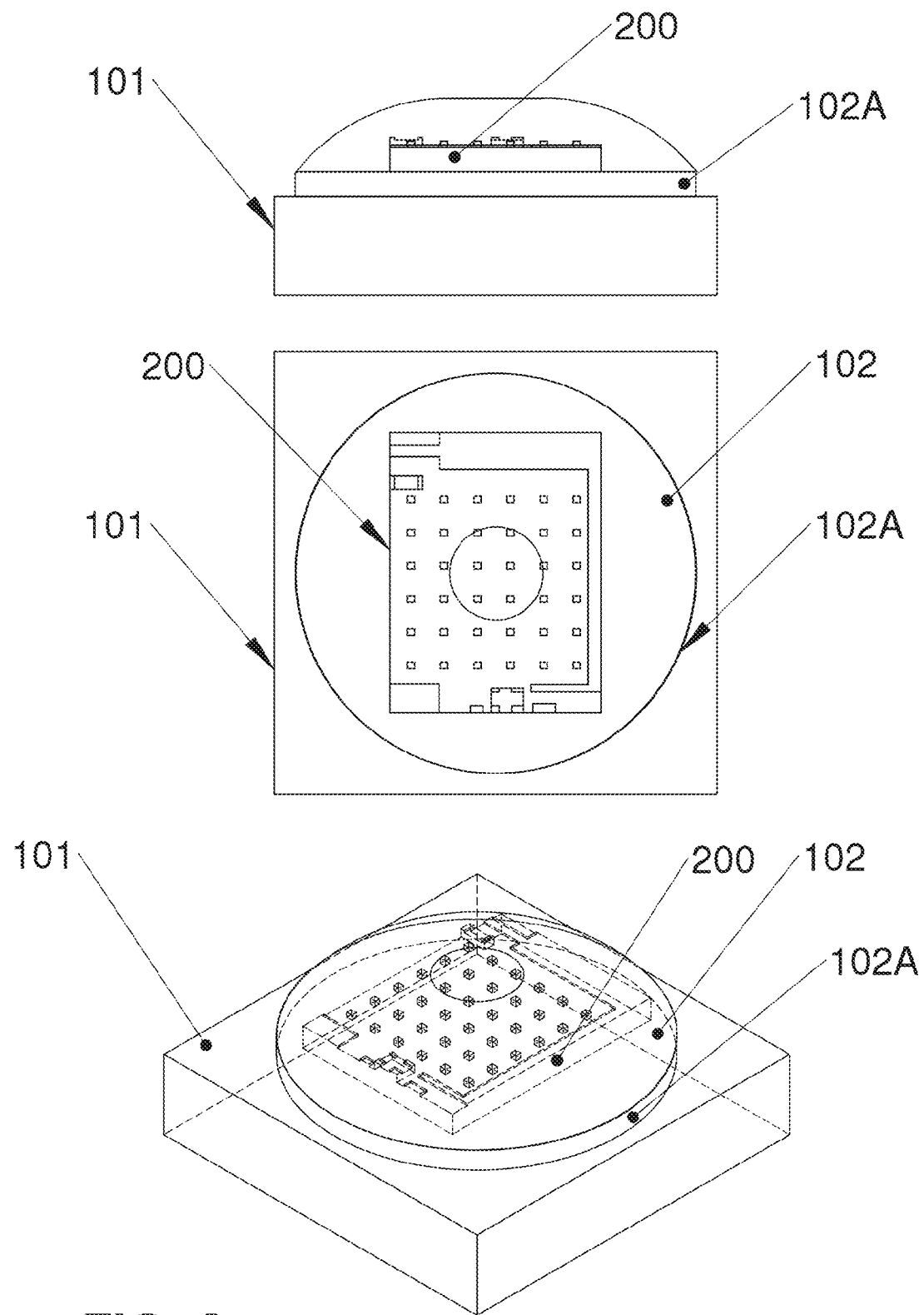
FIG. 2 is a side, top, and perspective view of an embodiment of the lens mounted on a COB (chip on board) substrate containing a matrix of light emitting diode dies.

A specific quantum dot arrangement of at least one or a plurality combination arrangement for a specific desired colour that is formed into the GAUSSIAN SURFACE LENS QUANTUM PHOTON CONVERTER, as illustrated in FIG. 2, is in any instance disposed and in communication with a typical LED arrangement 200 in the form of a single LED die or a plurality of dies in some matrix form. The GAUSSIAN SURFACE LENS QUANTUM PHOTON CONVERTER 102 is a photon-interactive Gaussian surface lens that converts incident photons from a single or a plurality of wide band gap semiconductor class light emitting diode dies, into a secondary emission of photons emanating from a composite photon transparent colloidal stationary suspension of quantum dots, high efficiency phosphors, a combination of quantum dots and high efficiency phosphors and nano-particles of metal, silicon or similar semiconductors from the IIIB and IVB Group of the Periodic Table and any nano-material and/or micro/nano spheres that responds to Rayleigh Scattering and/or Mie Scattering; and a plurality of quantum dots in communication with said nano-particles in said suspension. Further, GAUSSIAN SURFACE LENS QUANTUM PHOTON CONVERTER 102 in an embodiment shown in FIG. 2 is disposed and in communication with a sub base 102A that can be metallic or thermal plastic and function as a heat sink completing a thermodynamic circuitous path for heat generated by said plurality of electrical current carrying LED dies; and whose circuitous path travels and is in thermal and mechanical communication from LED dies to base 102A and on through the substrate main base 101.

Figure 3:
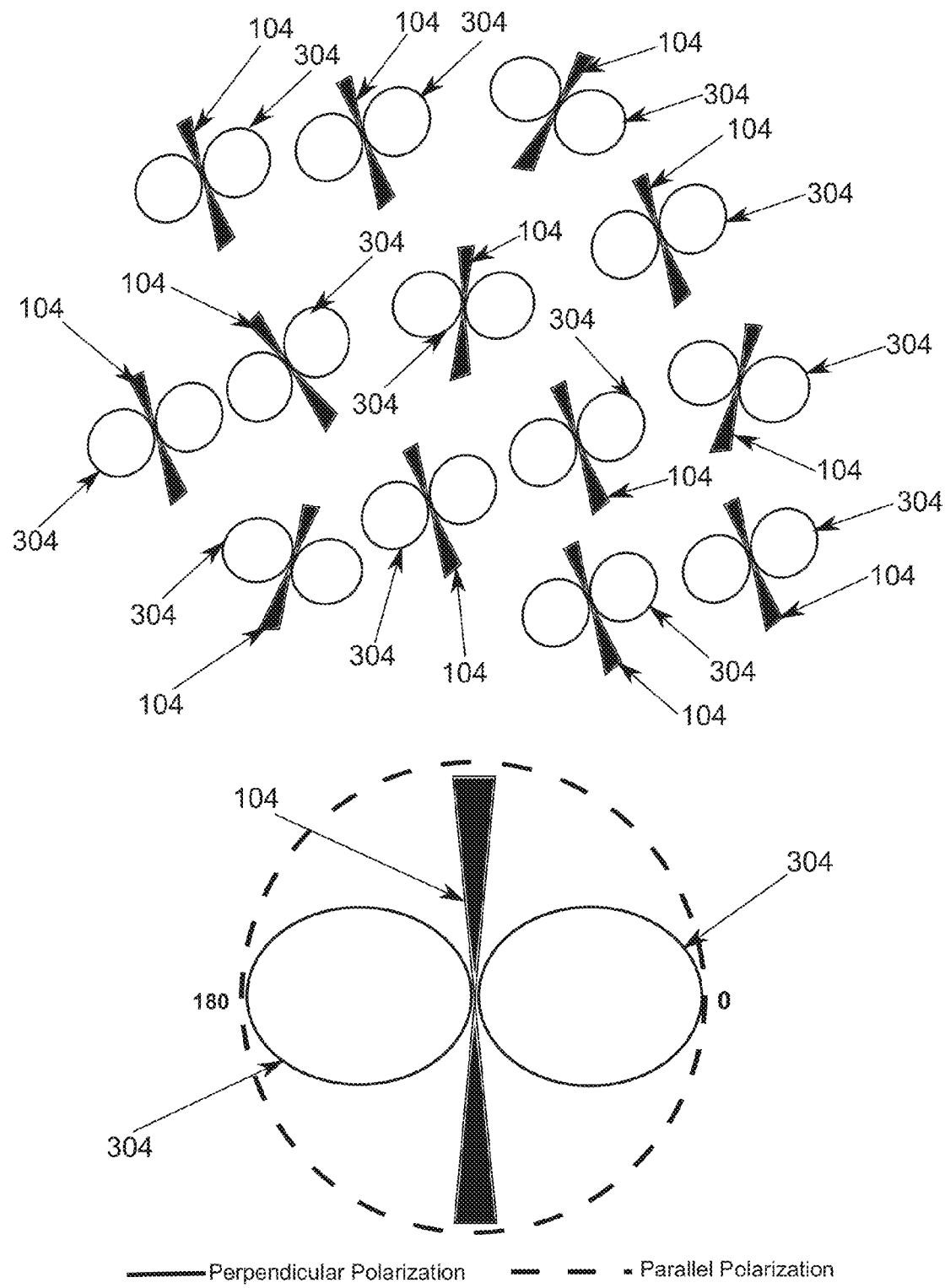
FIG. 3 is a drawing of a plurality of suspended and stationary nano-particles of silicon or other semiconductor nano-particles with their representative optical dipole radiation patterns (scattered); illustrating photon scattering dipole radiation patterns, typical of Rayleigh Scattering phenomena.

FIG. 3 relates to the behavior of nanoparticles 104 such as silicon or some other semiconductor material, referenced to Rayleigh-Scattering of incident photons (~450 nm) emanating from a light emitting diode source; whereby said silicon behaves like a mirror. With said nanoparticles 104 it can be explained that Rayleigh-Scattering having a highly frequency dependent characteristic creates a photon scattering pattern of an electric dipole (antenna) moment expressed as p=qd In the simple case of two point charges, one with charge +q and one with charge −q, the electric dipole moment p is: where d is the displacement vector pointing from the negative charge to the positive charge. Thus, the electric dipole moment vector p points from the negative charge to the positive charge. The electric field of the incident wave (photon) accelerates the charged particle, causing it, in turn, to emit radiation 304 at the same frequency as the incident wave, and thus the wave is scattered. Rayleigh-Scattering is similar to Thomson scattering. Thomson Scattering is an important phenomenon in plasma physics and was first explained by the physicist J.J. Thomson. As long as the motion of the particle is non-relativistic (i.e. its speed is much less than the speed of light), the main cause of the acceleration of the particle will be due to the electric field component of the incident wave, and the magnetic field can be neglected. The particle will move in the direction of the oscillating electric field, resulting in electromagnetic dipole radiation 304. The moving particle radiates most strongly in a direction perpendicular to its motion and that radiation will be polarized along the direction of its motion. Therefore, depending on where an observer is located, the light scattered from a small volume element may appear to be more or less polarized.

Resonating Silicon Mirrors

In accord with quantum mechanics, each silicon mirror 104 will resonate when excited by soft UV (~450 nm) light to establish a standing wave emanating within. The precise wave pattern is determined by the wavelength that the incident light has in silicon, which is about one-third of its value in air. Each silicon mirror 104 essentially behaves like an antenna, absorbing light and re-emitting it in a form possessing the symmetry of the standing wave inside the flat silicon nanostructures 104, with said light from said silicon mirrors 104 interfering constructively or destructively, depending on the direction of the incident light.

Said silicon mirrors 104 resonate like an electric dipole when excited by soft uV light at ~450 nm. As said silicon mirrors 104 are arranged in a pseudo-random arrangement, emissions from each dipole 104 interfere constructively when light of this wavelength is used and a single beam of light emerges from the same side of the normal as the incoming beam in what is known as negative transmission.

When 450 nm light hits the silicon mirrors 104, an isotropic standing wave is formed and radiation exits in four orthogonal directions. This in effect increases the amount of photon emission propagated from the quantum dots contained within said GAUSSIAN SURFACE LENS QUANTUM PHOTON CONVERTER 102 as illustrated in FIG. 2.

Figure 4:
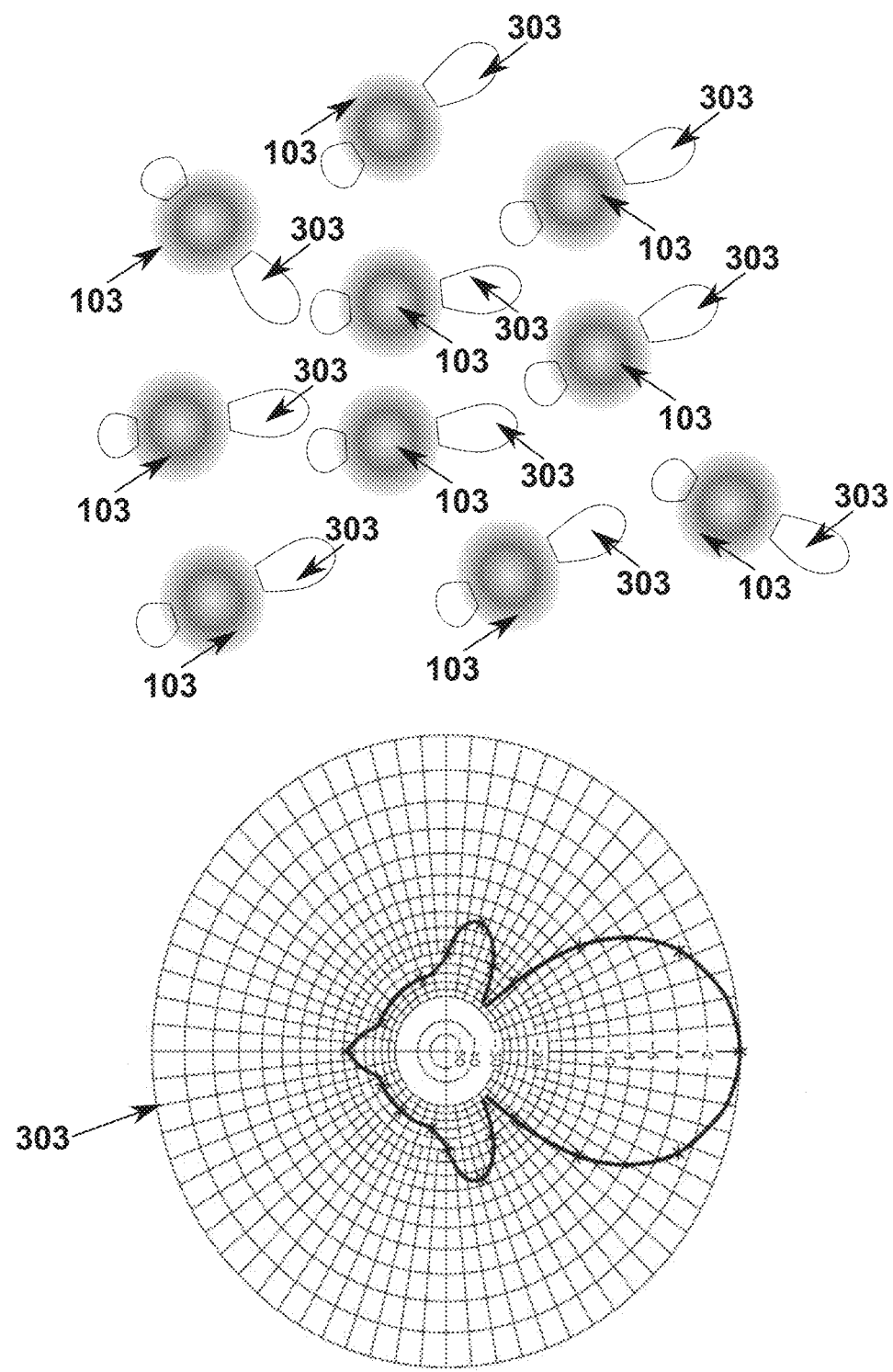
FIG. 4 is a drawing of a plurality of suspended and stationary glass or polymer micro spheres, with their representative optical highly-directional front gain dipole radiation patterns (scattered); illustrating photon optical highly-directional front gain dipole radiation patterns, typical of Mie Scattering phenomena.

As shown in FIG. 4 with larger spherical glass particles 103, in comparison to said nanoparticles 104 in FIG. 3, there exists a well defined directional radiation pattern likened to a Yagi-Uda Antenna system 303 due to the phenomena of Mie Scattering, which tends to scatter longer wavelengths of light. Ergo, the combined action of short uV photons (~450 nm), incident of said LED dies and the Stokes shift eminent with monochromatic quantum dot emission, produces longer wavelength light of red and green that is scattered by the Mie solution.

Figure 5:
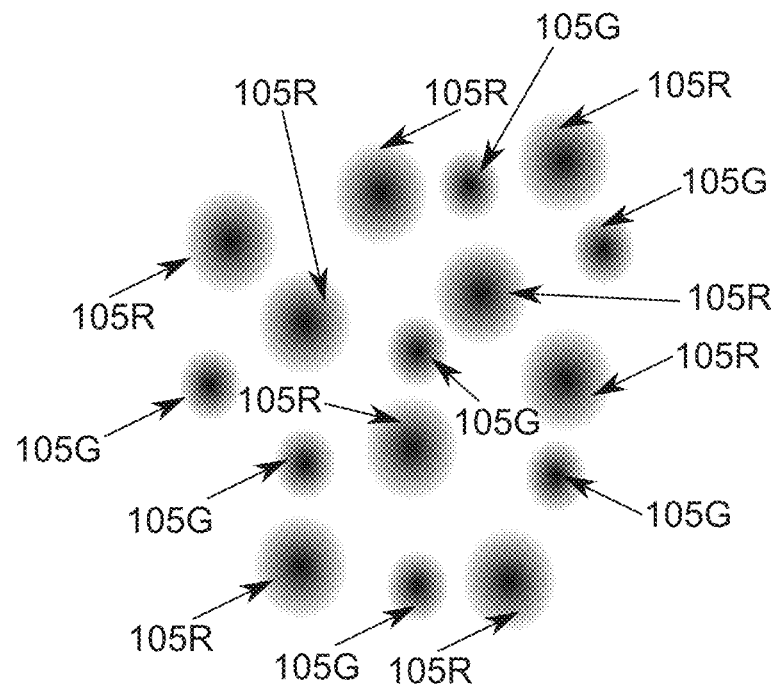
FIG. 5 is a drawing of a plurality of suspended and stationary red and green quantum dots with their Stokes Scattering absorption (450 nm) and narrow pass-band emission response curves for the red (610 nm) and the green (530-560 nm) quantum dots.
Figure 5:
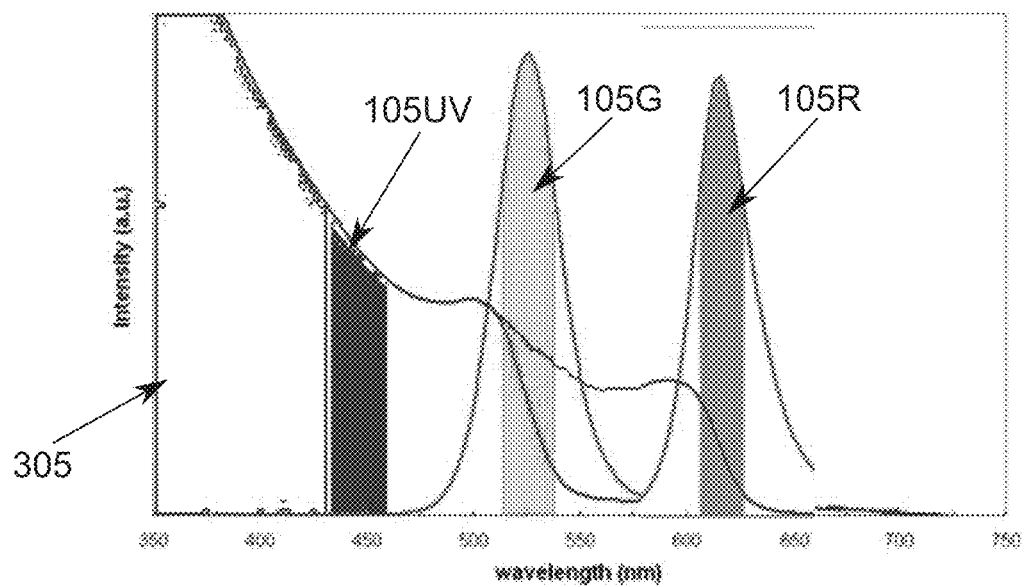

In one embodiment of said present invention as shown in FIG. 5; a uniform plurality, but not limited to a uniform plurality, of quantum dots of a monochromatic single plurality of quantum dots or a plurality group of different size (monochromatic) quantum dots are in communication and disposed in said stationary colloidal suspension defined as the GAUSSIAN SURFACE LENS QUANTUM PHOTON CONVERTER 102 as illustrated in FIG. 2. It should be obvious to those steeped in the art that the illustrated absorption emission curves 305 for the red quantum dots 105R and the green quantum dots 105G are results of a Stokes shift in photon emission narrow band spectra for the quantum dots being excited by quantum secondary emission within the volume of the stationary colloidal suspension.

Figure 6:
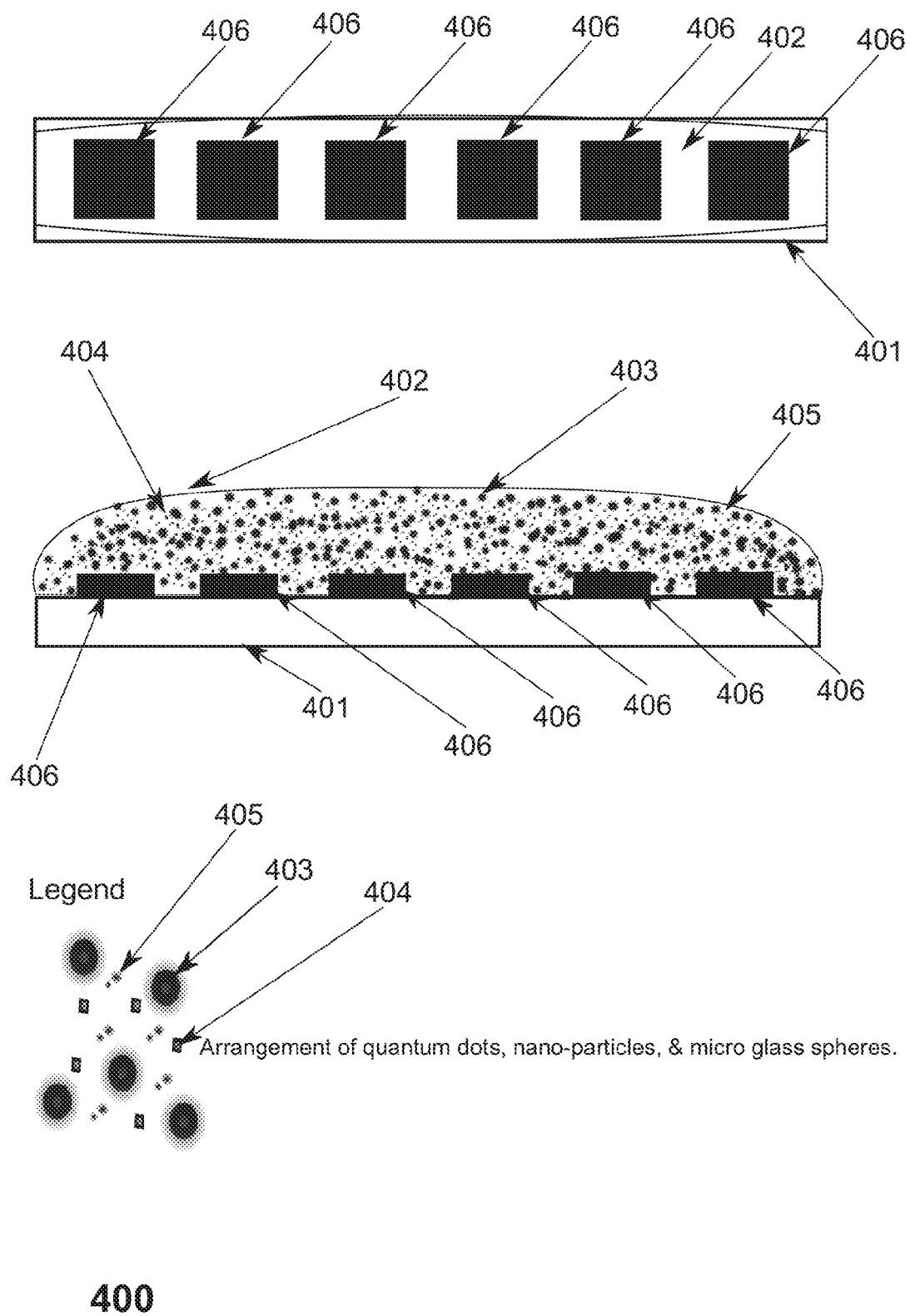
FIG. 6 is an illustration of a single inline linear array of light emitting diode dies with the quantum photon converter lens mounted on, the array substrate; utilized for uniform light dispersion for applications of fluorescent tube replacement and other possibilities.

Another embodiment of the present invention is illustrated in FIG. 6 where a uniform plurality, but not limited to a uniform plurality, of quantum dots of a monochromatic single plurality of quantum dots or a plurality group of different size (monochromatic) quantum dots are in communication and disposed in said stationary colloidal suspension defined as the GAUSSIAN SURFACE LENS QUANTUM PHOTON CONVERTER 102 as illustrated in FIG. 2 that engulf a single inline linear array of LED dies 406 disposed and in communication with a substrate 401; and where the stationary colloidal suspension is comprised of a plurality of quantum dots 405 that are either a plurality of single monochromatic characteristic (size) such as red, green, or blue quantum dots or they can exist in a combination pair of red and green quantum dots 405. In addition; the stationary colloidal suspension has disposed and is in common photon communication with the disposed combination of quantum dots 405, and/or high efficiency phosphors; and nano-particles 404 of metal, silicon or similar semiconductors from the IIIB and IVB Group of the Periodic Table and any nano-material and/or micro/nano spheres 403 that responds to Rayleigh Scattering and/or Mie Scattering.

It should be obvious and understood by those steeped in the art that any embodiment of the present invention is not limited by utilizing a plurality combination of more than one type size of quantum dot; and whereby the size of a quantum dot determines its characteristic monochromatic spectra emission due to incident photon absorption emanating from the intrinsic photon emission of a wide band gap semiconductor fabricated as a light emitting diode. The plurality of a combination of more than one type size of quantum dot is utilized to produce "white" light emitted and propagated from a fabricated light emitting diode, and any selection of a desired "white" colour temperature range given in degrees Kelvin is controlled by careful ratio selection of a plurality of red to green quantum dots. Thus it is established by some prior art that a stand-alone chemical colloidal suspension combination of different size diameter quantum dots, in the range of 2 to 10 nanometers, can produce multi-chromatic colour resultants or that by utilizing a combination of red, green and blue quantum dots a "white" colour will result.

However, another approach and intention of the present invention is to utilize ultra-small quantum dots 123 (shown in FIG. 7) that are less than 2 nanometers in size diameter.

Michael A. Schreuder (Dept. of Chemistry at Vanderbilt University) and Sandra J. Rosenthal (Department of Electrical Engineering and Computer Science and Chemistry Dept. at Vanderbilt University) report in a 2010 article titled: "White Light-Emitting Diodes Based on Ultra-small CdSe Nano-crystal Electroluminescence"[1] that white light-emitting diodes fabricated with ultra-small CdSe nanocrystals, which demonstrate electroluminescence from a size of nanocrystals (<2 nm) previously thought to be unattainable. These LEDs have excellent color characteristics, defined by their pure white CIE color coordinates (0.333, 0.333), correlated colour temperatures of 5461-6007 K, and color rendering indexes as high as 96.6. The effect of high voltage on the trap states responsible for the white emission is also described.

Figure 7:
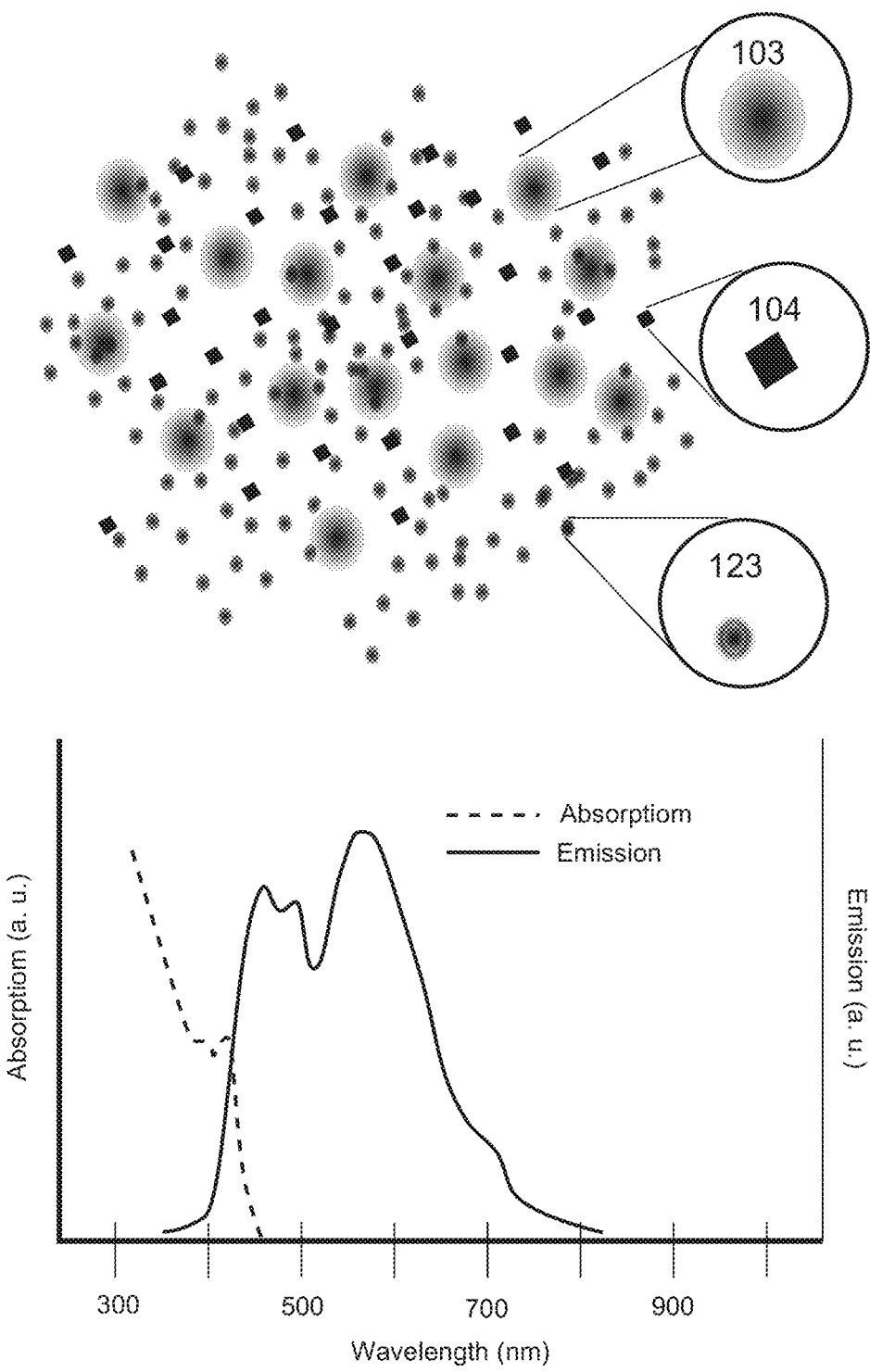
FIG. 7 is a plurality of glass or polymer micro spheres, nano-particles, and ultra small white quantum dots that are less than 1.7 nanometers in diameter; with their absorption (450 nm) and wide band emission (430-710 nm) curves.

The illustration and graph of FIG. 7 shows that by utilizing a plurality of ultra-small (<2 nm) quantum dots 123 that are disposed within the stationary colloidal suspension volume; and in photon communication with a disposed plurality of glass or polymer micro spheres and a plurality of nano-particles 104 of metal, silicon or similar semiconductors from the IIIB and IVB Group of the Periodic Table and any nano-material and/or micro/nano spheres 103 that responds to Rayleigh Scattering and/or Mie Scattering, correlated colour temperatures in a range of 5461 to 6007 K is attainable. The absorption/emission curve for the ultra-small (<2 nm) quantum dots shows a resultant emission in a range of 430 to 710 nanometers. This embodiment of the present invention allows for a single size diameter (<2 nm) ultra-small quantum dot plurality 123 of the said GAUSSIAN SURFACE LENS QUANTUM PHOTON CONVERTER 102 as illustrated in FIG. 2 to produce "white" light from a fabricated wide band gap semiconductor light emitting diode.

Figure 8:
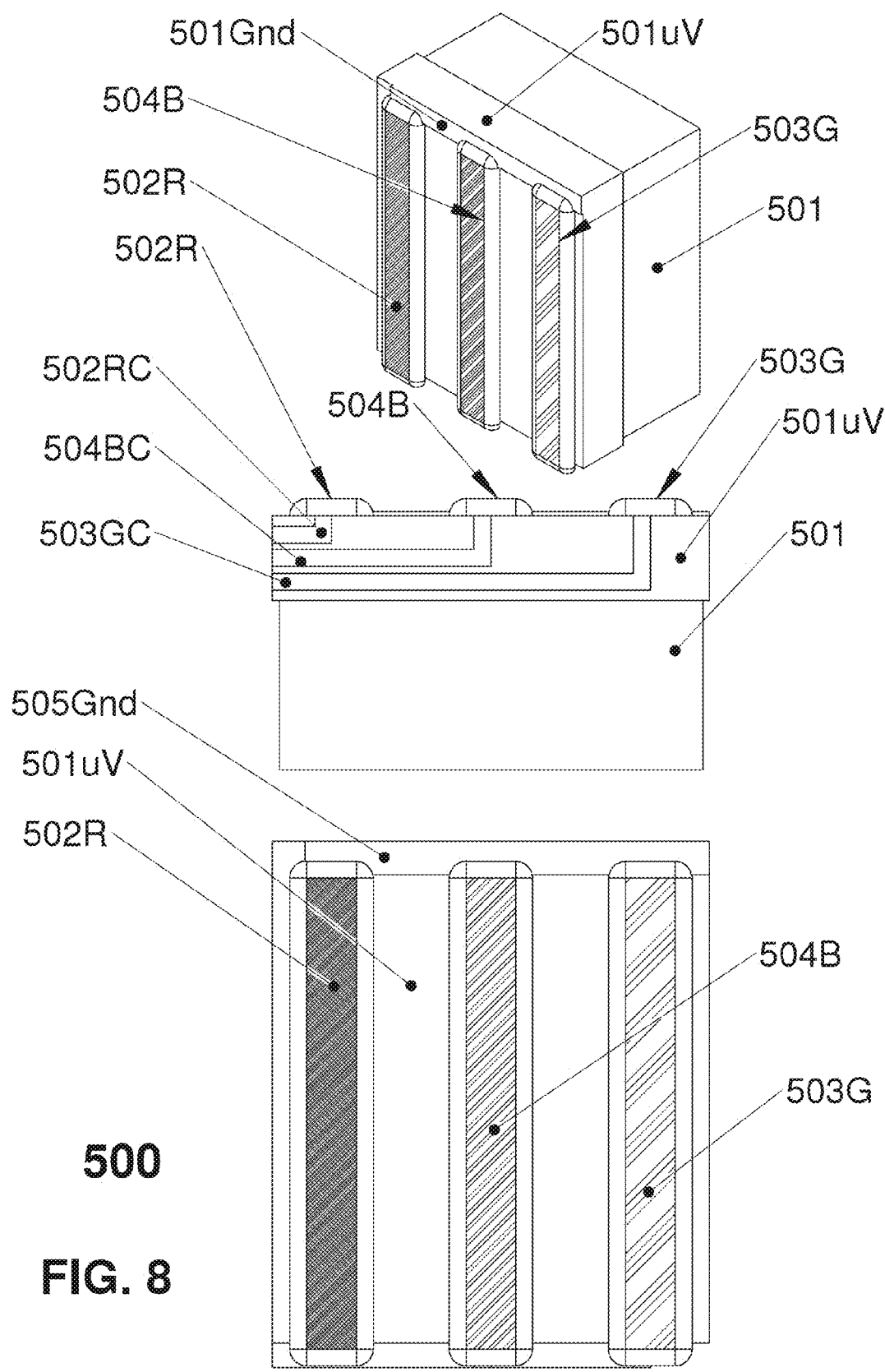
FIG. 8 is an illustration of a thin film embodiment of invention, whereby red, green, and blue quantum dots are applied to the surface of a flexible (or fixed) transparent surface and said red, green, and blue quantum dots are electrically separated for individual or combined electrically control for emission enhancement and colour selection.

Another embodiment of the present invention is in the utilization of a disposed layered combination of a stationary colloidal suspension volume 500 as shown in FIG. 8 that has disposed on a light emitting diode COB (chip on board) a first photon transparent stationary colloidal suspension volume segment 501 containing a plurality of ultra-small quantum dots 123 (shown in FIG. 7) or a red 105R and green 105G quantum dot plurality ratio (shown in FIG. 5), whereby the first photon transparent stationary colloidal epoxy suspension volume segment 501 is comprised of a plurality of quantum dots, glass or polymer micro spheres, and nano-particles 104 (shown in FIGS. 1 & 3) of metal, silicon or similar semiconductors from the IIIB and IVB Group of the Periodic Table and any nano-material and/or micro/nano spheres 103 (shown in FIGS. 1 & 4) that responds to Rayleigh Scattering and/or Mie Scattering. There is disposed on first photon transparent stationary colloidal suspension volume segment 501 a second uV (ultra violet) attenuating photon pass band filter member means 501uV that is disposed and in photon communication with the first segment member means 501. There is disposed on second uV (ultra violet) attenuating photon pass band filter 501uV a third disposed inline parallel treble array; consisting of a first disposed strip of a red photon transparent stationary colloidal epoxy suspension volume segment 502R, a second disposed strip blue photon transparent stationary colloidal epoxy suspension volume segment 504B, and a third disposed strip green photon transparent stationary colloidal epoxy suspension volume segment 503G. Whereby all members of said third disposed inline parallel treble array 502R, 504B, & 503G are in photon communication with all first disposed inline parallel treble array, and second uV (ultra violet) attenuating photon pass band filter 501uV.

The first disposed strip of a red photon transparent stationary colloidal epoxy suspension volume segment 502R contains the plurality of red quantum dots, the nano-particles and said glass or polymer micro spheres; the second disposed strip blue photon transparent stationary colloidal epoxy suspension volume segment 504B contains the plurality of blue quantum dots, the nano-particles and said glass or polymer micro spheres; and a third disposed strip green photon transparent stationary colloidal epoxy suspension volume segment 503G contains the plurality of green quantum dots, said nano-particles and the glass or polymer micro spheres. Disposed and in electrical and mechanical communication with the each individual red strip member means 502R, blue strip segment 504B, and green strip 503G are three disposed individual and electrically separate electrically conductive metallic connexions to the outside world; one said connexion for said red strip 502RC, one connexion for said blue strip 504BC, and one said connexion for said green strip 503GC. Also disposed and in common electrical connexion with all said red 502R, blue 504B, and green 503G strip segments is electrically conductive metallic strip (ground) member means 501Gnd that is the electrical common ground connexion to the outside world.

Figure 9:
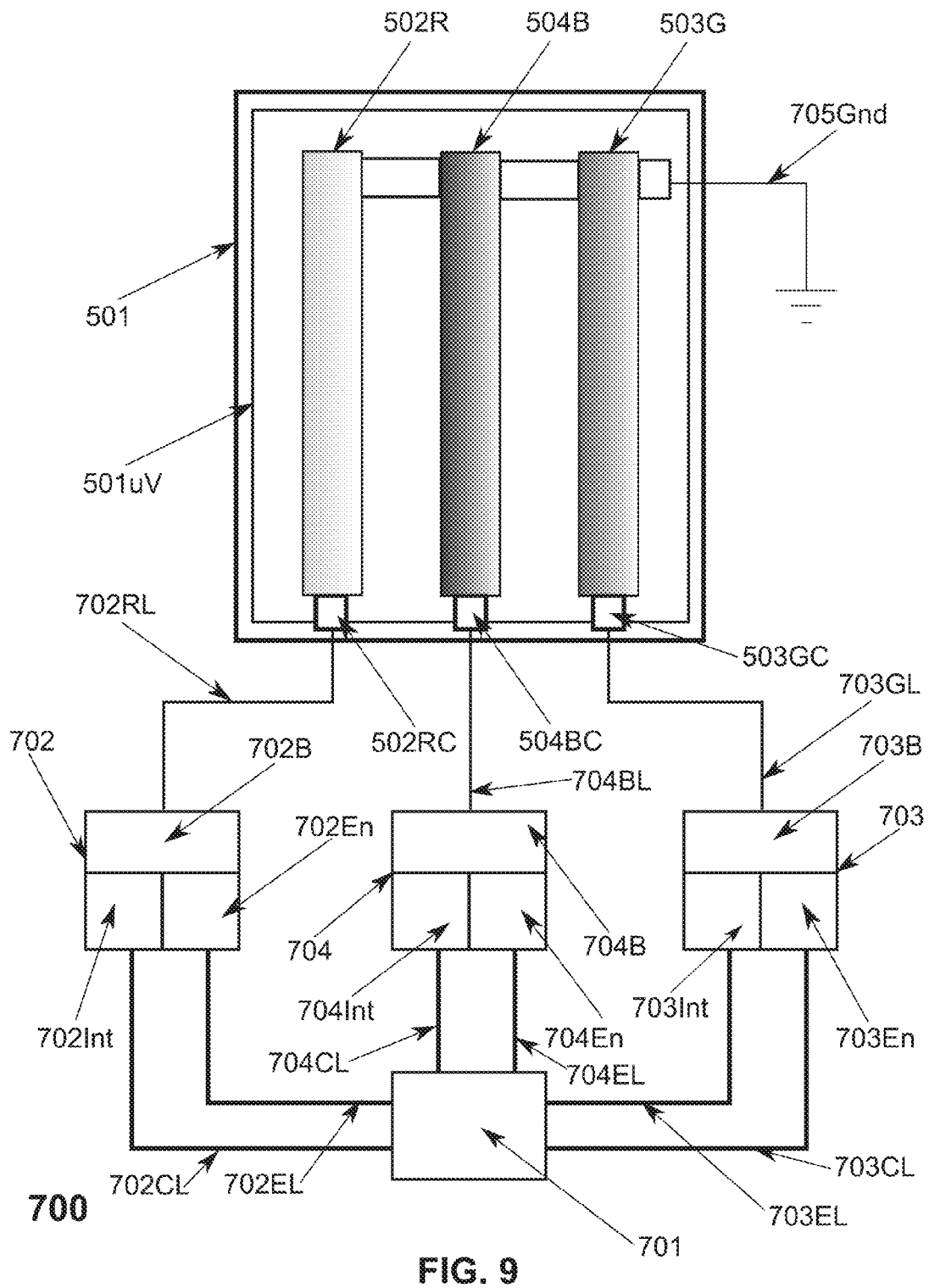
FIG. 9 is an illustration of a thin film embodiment of the invention, whereby red, green, and blue quantum dots are applied to the surface of a flexible (or fixed) transparent surface and said red, green, and blue quantum dots are electrically separated for individual or combined electrically control for emission enhancement and colour selection. The separated red, blue, and green quantum dots are applied over a thin film of a uV (ultra-Violet) material means that filters out any ultraviolet light emitted from a stationary colloidal suspension of ultra small "white" quantum dots. The separated red, blue, and green quantum dots are controlled by a microcontroller for colour and intensity.

In this embodiment of the present invention shown in FIG. 8 it is considered as an action, when a source of incident and intrinsic uV photons (~450 nm) emanating from a wide band gap light emitting diode disposed and contained within the first photon transparent stationary colloidal suspension volume segment member means 501, by a plurality of propagated ballistic photons from wide band gap light emitting diode (not shown in figure) "white" light with an effective pass band of from 430 to 710 nm will be produced as a resultant of the action of ultra-small quantum dot 123 absorption and emission. The "white" light with an effective pass band of from 430 to 710 nm will contain an a level of uV (~450 nm) photons and as another intention of the present invention this uV (~450 nm) level will be filtered and attenuated to an appreciable amount so as not to be absorbed by the first disposed strip of a red photon transparent stationary colloidal epoxy suspension volume segment member means 502R containing plurality of red quantum dots, said nano-particles and said glass or polymer micro spheres; the second disposed strip blue photon transparent stationary colloidal epoxy suspension volume segment member means 504B containing plurality of blue quantum dots, the nano-particles and said glass or polymer micro spheres; and a third disposed strip green photon transparent stationary colloidal epoxy suspension volume segment 503G containing plurality of green quantum dots, the nano-particles and said glass or polymer micro spheres. This purpose-of-action in filtering out any uV (~450 nm) photons by the uV filter segment 501uV is to prevent any pre-triggering by uV (~450 nm) photons of any of the third segment red strip 502R, or blue strip 504B, or green strip 503G. Another novelty of the said present invention is the action of said uV filter film 501uV to attenuate to an appreciable level any uV photons utilized for purposely "not" stimulating the quantum dot strips by absorption and emission action, but rather stimulating the quantum dots contained within the strips by passing an electrical current through each strip in a circuitous path completed by a controllable and programmable electronic voltage source connected to the electrical connexions 502RC, 504BC, & 503GC and electrical common ground connexion 501Gnd disposed and in electrical communication with the red 502R, blue 504B, and green 503G quantum dot strip stationary suspension volumes. It is by this action that another novelty and intention of the invention presents itself by electrically controlling a final colour output from the epoxy composite multi-stationary suspension volume method means 500 thus possessing the capability of producing red, green, blue or white light from a single LED source Another novel embodiment according to the invention is shown in FIG. 9, which is a block diagram for illustrating how various colour combinations are achieved by controlling the enabling and intensity of said colour strips 502R, 504B, & 503G. This preferred embodiment of the invention utilizes a microcontroller 701 that is in communication with an enable and intensity level circuit 702, and microcontroller sends a command signal on an enable/disable line 702EL to a logic control circuit 702En that is in communication with a buffer output stage 702B and whereby buffer output stage 702B is in communication with red quantum dot strip 502R by red signal line 702RL. Further, the microcontroller 701 controls on/off enabling and intensity colour levels by sending a programmed enable/disable logic decision signal on its control line 702EL and sends an intensity level command by a control line 702CL to a intensity level circuit (like a digital to analogue converter) 702Int and this signal level is isolated by buffer stage 702B and sent along red signal line 702RL and is in communication with red quantum dot strip 502R; to control the on and off and colour intensity of the red quantum dot strip 502R as determined by an algorithm.

In addition, this preferred embodiment of the invention utilizes a microcontroller 701 that is in communication with an enable and intensity level circuit 704, and microcontroller sends a command signal on an enable/disable line 704EL to a logic control circuit 704En that is in communication with a buffer output stage 704B and whereby buffer output stage 704B is in communication with blue quantum dot strip 504B by blue signal line 704BL. Further, said microcontroller 701 controls on/off enabling and intensity colour levels by sending a programmed enable/disable logic decision signal on its control line 704EL and sends an intensity level command by a control line 704CL to a intensity level circuit (like a digital to analogue converter) 704Int and this signal level is isolated by buffer stage 704B and sent along blue signal line 704BL and is in communication with blue quantum dot strip 504B; to control the on and off and colour intensity of said blue quantum dot strip 504 as determined by an algorithm.

In addition, this preferred embodiment of the invention utilizes a microcontroller 701 that is in communication with an enable and intensity level circuit 703, and microcontroller sends a command signal on an enable/disable line 703EL to a logic control circuit 703En that is in communication with a buffer output stage 703B and whereby buffer output stage 703B is in communication with green quantum dot strip 503R by green signal line 703RL. Further, said microcontroller 701 controls on/off enabling and intensity colour levels by sending a programmed enable/disable logic decision signal on its control line 703EL and sends an intensity level command by a control line 703CL to a intensity level circuit (like a digital to analogue converter) 703Int and this signal level is isolated by buffer stage 703B and sent along green signal line 703RL and is in communication with green quantum dot strip 503R; to control the on and off and colour intensity of said green quantum dot strip 503 as determined by an algorithm.

Thus from having said microcontroller 701 given instructions from an algorithm, and with a LED that contains ultra-small quantum dots 123 (as shown in FIG. 7); any colour combination can be created from the control of the red, blue, and green quantum dot strips (502R, 504B, & 503G).

Figure 10:
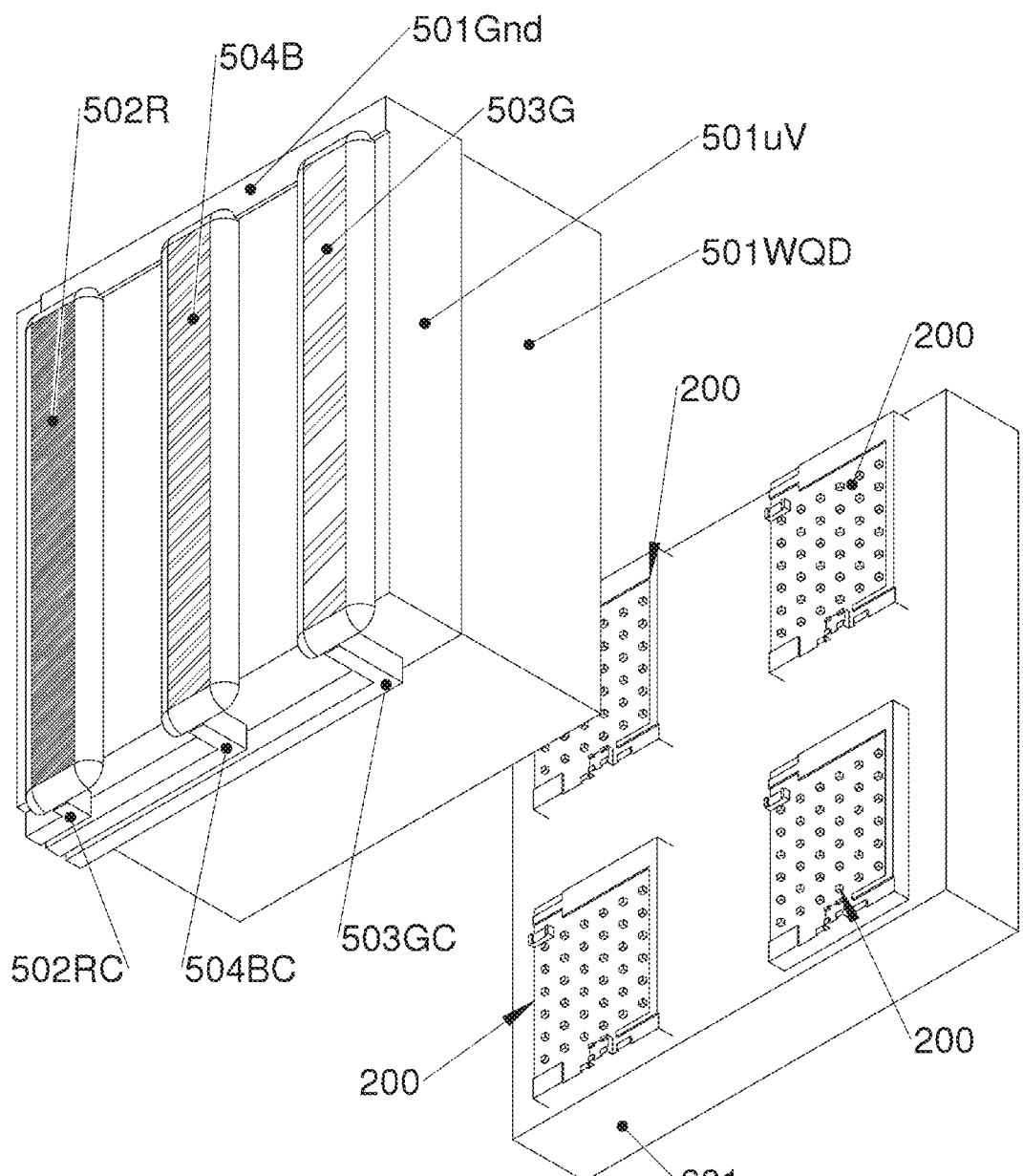
FIG. 10 is an exploded illustration of a thin film embodiment of the present invention, whereby red, green, and blue quantum dots are applied to the surface of a flexible (or fixed) transparent surface and said red, green, and blue quantum dots are electrically separated for individual or combined electrically control for emission enhancement and colour selection. The separated red, blue, and green quantum dots are applied over a thin film of a uV (ultra-Violet) material means that filters out any ultraviolet light emitted from a stationary colloidal suspension of ultra small "white" quantum dots; whereby the above arrangement is mounted on a COB (chip on board) LED structure substrate with a single or plurality of LED dies mounted on the substrate.

Another preferred embodiment of the invention is illustrated by an exploded view in FIG. 10; where a heat sink substrate 601 has disposed at least one or a plurality of a COB LED cascaded array, but not limited to a cascade array, of a plurality of LED dies 200. Further, said white quantum dot disposed stationary colloidal epoxy suspension 501 WQD is in photon communication with a thin film uV filter 501uV and the uV filter 501uV has disposed and is in photon communication with a plurality of mono-chromatic quantum dot strips that individually contain only red quantum dots for the red strip 502R, and only blue quantum dots for the blue strip 504B, and only green quantum dots for the green strip 503G; and where each quantum dot strip has disposed and is in electrical communication with a conductive electrically isolated control channel.

A red quantum dot strip 502R is disposed on uV filter film 501uV and is in electrical communication with a red conductive electrically isolated control channel 502RC; a blue quantum dot strip 504B is disposed on uV filter film 501uV and is in electrical communication with a blue conductive electrically isolated control channel 504BC; a green quantum dot strip 503G is disposed on uV filter film 501uV and is in electrical communication with a green conductive electrically isolated control channel 503GC.

Figure 11:
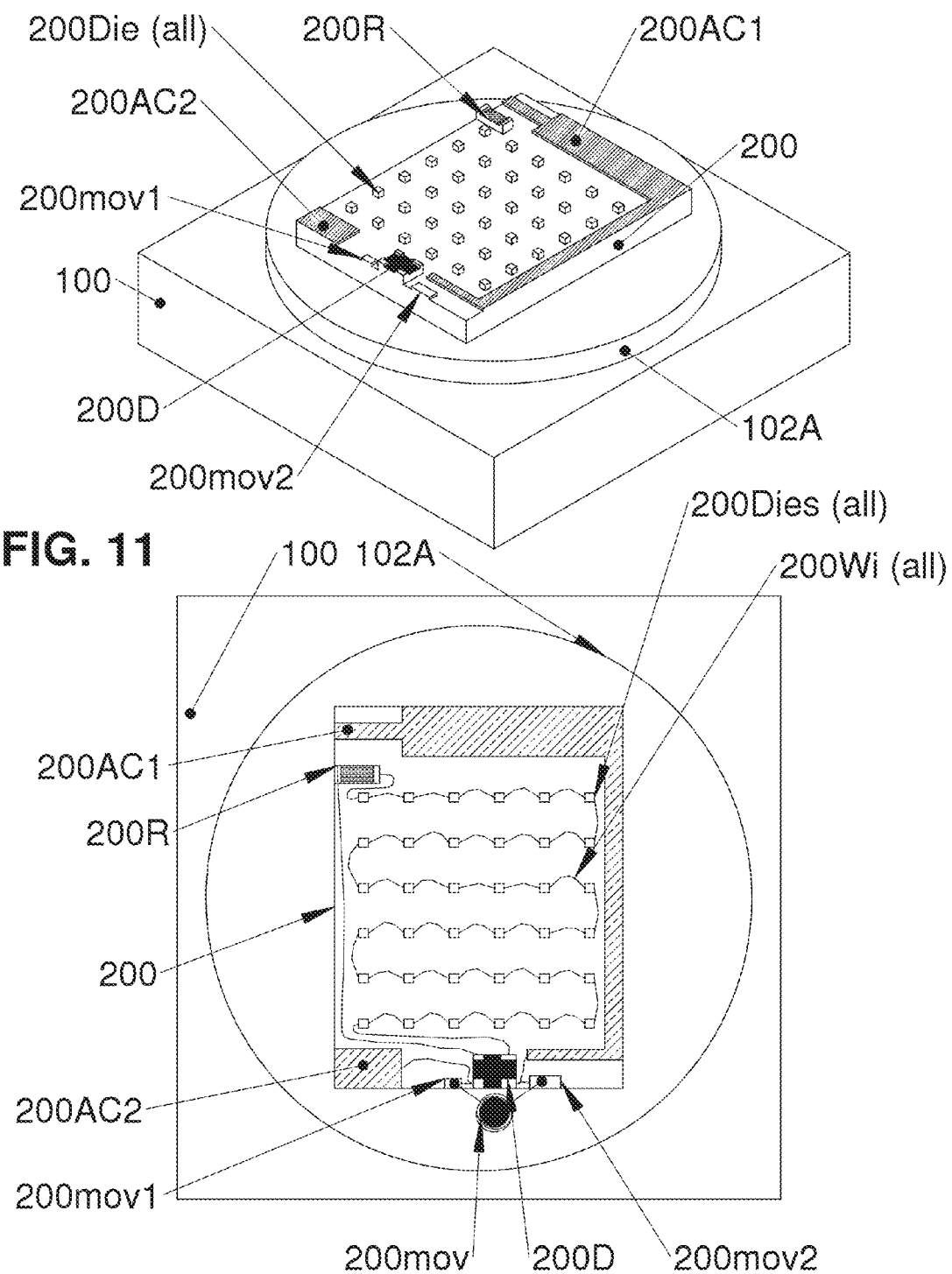
FIG. 11 A view of the thin film embodiment of said invention, whereby red, green, and blue quantum dots are applied to the surface of a flexible (or fixed) transparent surface and said red, green, and blue quantum dots are electrically separated for individual or combined electrically control for emission enhancement and colour selection. The separated red, blue, and green quantum dots are applied over a thin film of a uV (ultra-Violet) material means that filters out any ultraviolet light emitted from a stationary colloidal suspension of ultra small "white" quantum dots; whereby the above arrangement is mounted on a COB (chip on board) LED structure substrate with a single or plurality of LED dies mounted on said substrate and connected by a plurality of circuitous electronic components allowing for instant operation on either 120 Vac or 240 Vac.

Another embodiment of said present invention is illustrated by two views in FIG. 11, where a single COB LED cascaded array 200, but not limited to a cascade array, of a plurality of LED dies is part and parcel to a complete electrical circuit of components that provides electrical power and control over the on and off capability said cascade array; that is disposed and in communication with a thermally conductive substrate 102A, which is disposed and in communication with a thermally conductive base array 100 that aides with thermally conductive substrate 102A in transferring any heat generated by said COB LED cascaded array 200 during its power "on" cycle.

In FIG. 11 said electrical components identified in unison as a power control and intensity circuit is comprised of; a plurality of AC input conductive channel strips 200AC1 & 200AC2 that are disposed on COB substrate 200 and are electrically connected by wires to the input connexions of a full wave bridge rectifier 200D and said full wave bridge rectifier is connected in parallel to a MOV (metal oxide varistor) 200mov by said MOV's conductive pads 200mov1 & 200 mov2; and said MOV component 200mov is utilized for voltage spike and surge protection of said COB LED die array 200. Further a AC voltage instant level detect circuit (detects instantly 120 or 240 Vac and adjusts the output level to a safe operation applied voltage to the LED array as a means of over voltage protection), a current limiting protection with intensity control circuit, and all are combined internally as a single hybrid chip 200R is disposed and in series electrical communications with said COB LED die array for circuit completion.

Figure 12:
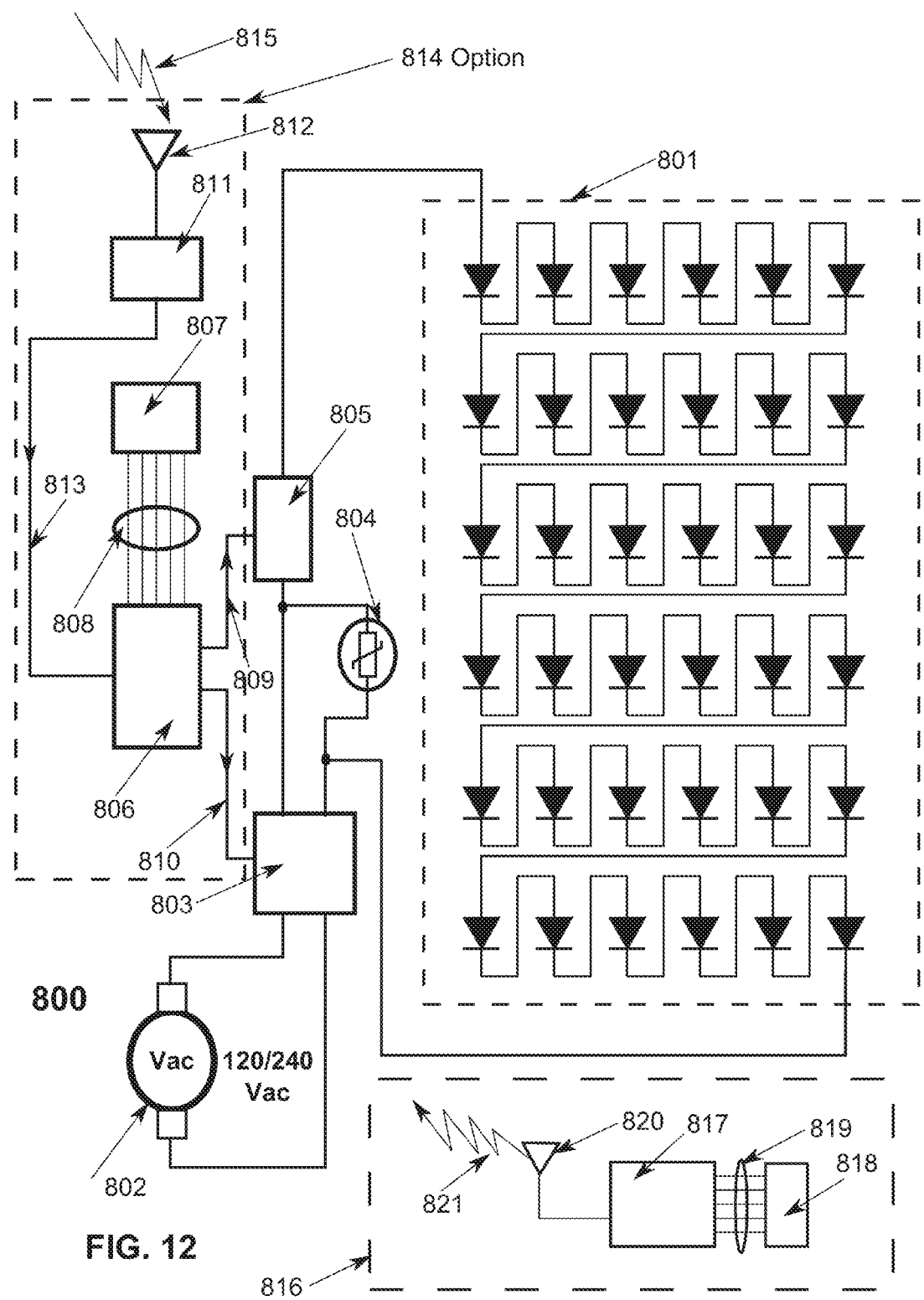
FIG. 12 An illustration of a plurality of cascaded LED dies mounted and wired in cascade to a plurality of voltage spike absorption, current limiting and rectifying electronic component means all in communication to enable a plurality of LED dies to properly function and emit light from a power mains alternating current source with special power level means for accepting either 120 Vac or 240 Vac for proper operation; and illustrating the option of utilizing a wireless transceiver method means for remotely and wirelessly controlling COB (chip on board) LED colour and intensity.

Another preferred embodiment of the present invention is shown in the electrical diagram 800 of FIG. 12; where an AC mains powered 802 full wave bridge rectifier 803, and where the AC mains power source can be either 120 or 24 volts AC, is connected in parallel to a MOV (metal oxide varistor) 804; and said MOV component 804 is utilized for voltage spike and surge protection of said COB LED die array 801. Further a first disposed component of a AC voltage instant level detect circuit 805 that detects instantly 120 or 240 Vac from the power mains 802 and adjusts the output voltage level to a safe operation applied voltage to the LED array as a means of over voltage protection, a current limiting protection with intensity control circuit, and all are combined internally as a single hybrid chip 805 is disposed and in series electrical communications with the COB LED die array 801 for circuit completion. In addition, a second disposed component of a hybrid chip 814 Option (optional circuit) is comprised of a microcontroller 806 and the microcontroller 806 is in communication with a decoder and memory circuit 807 by way of data lines 808. As a stand-alone system means, the microcontroller that is controlled by a algorithm disposed in the memory circuit 807 can operate the COB LED array 801 for periodic or continuous control of the COB LED array 801 or as a added feature option, the COB LED array enabling, disabling, and intensity can be controlled remotely and wirelessly by recited option 814 that contains a an ISM radio band micro-transceiver 811 that receives radio signals, but not limited to only radio signals, from an antenna 812 that receives intermittent or continuous transmissions from a wireless remote transmitter system means 816; and where the wireless remote transmitter system 816 contains and is in communication with a component member means of an encoder 818 that sends address and other data by a data line means 819 that is in communication with the encoder memory. The micro-transmitte 817 is in communication with an antenna 820 to transmit selective address and other memory data information to the remote and wireless receiver option 814 Option. The emote and wireless transmitter system means and remote and wireless receiver system co-exist as a remote control option method and apparatus for remotely controlling any individual or plurality of LED lighting fixtures and components. It should be obvious to anyone steeped in the art that any white light LED can be converted to a multi-coloured light, in effect, by utilizing the present invention's embodiments. Further it should be obvious to anyone steeped in the art that the GAUSSIAN SURFACE LENS QUANTUM PHOTON CONVERTER can be designed intrinsically as a device means disposed with LED dies for generating LED multi-coloured light; or a plurality of LED multi-coloured lights; or the GAUSSIAN SURFACE LENS QUANTUM PHOTON CONVERTER can be utilized as a lens system means without any disposed LED dies; and further, the GAUSSIAN SURFACE LENS QUANTUM PHOTON CONVERTER can be disposed on any existing white LED light device means; or a plurality of LED devices; or any white light device other than a white LED light device; or a plurality of any white light devices other than a white LED light device.

FIG. 13 is a perspective drawing for another embodiment of said present invention showing a dual channel cascaded LED array system means 900 that is disposed with two COB LED array member means 200 on a common heat sink base substrate device means. Each COB LED array member means 200 is comprised of a disposed plurality of LED dies 200Dies (all) connected and in communication electrically with each other by interconnecting wire means 200Wi and all disposed on a COB substrate member means 200. There exists a thermal path and mechanical connexion communication between said COB LED array dies 200Dies (all) and COB substrate 200; and between said COB LED array 200 and said common heat sink base 760 substrate 100. Said MOV circuit member means 200mov utilized for overvoltage and surge protection is in electrical communication connexion directly to said connexion of MOV 200mov wires 200Wim to said AC voltage input terminal means 200AC1 & 200AC2; and said MOV surge protector component means 200mov can be a member means that can exist as a disposed external member means to said dual channel 765 cascaded LED array system means 900 or can exist disposed as an internal COB member means on said dual channel cascaded LED array system means 900.

Another embodiment of said present invention is for such action of said circuit component member means 200R to exist with several option method means of utilizing said current limit method means, but not limited to current limiting alone; and it can exist with such action utilizing said voltage enabling method means, but not limited to only voltage enabling method means; and it can exist with such action utilizing said intensity colour control action method means, but not limited to only intensity colour control. Any or all feature method means of current limit, voltage enabling and intensity colour control can exist by selective design features of a preprogrammed algorithm or by a specific fabrication design feature method means. Each said dual channel cascaded LED array system means 900 that is disposed with two COB LED array member means 200 on a common heat sink base substrate device means can be electrically connected to operate in parallel from a 120 VAC power mains source such as exists in the US and Japan or connected in series to operate from a 240 VAC power mains source such as exists in the UK and EU; and said parallel or series combination selection method means can be connected in either design selected method means internally during a fabrication procedure method means or can be connected externally by a consumer.

REFERENCES

[1] *Nano Lett.*, 2010, 10 (2), pp 573-576
DOI: 10.1021/nl903515g
Publication Date (Web): Jan. 11, 2010
Copyright © 2010 American Chemical Society

What is claimed is:

1. A photon converter disposed over a light emitting diode having a light emitting region providing photons therefrom at a selected wavelength: comprising:
    a stationary colloidal suspension volume lens comprising one of photon transparent epoxy and polymer plastic, disposed to receive said light emitting diode photons, said stationary colloidal suspension volume being removably disposed on said light emitting diode, said stationary colloidal suspension volume including
        a plurality of nano-particles of one of metal, silicon and similar semiconductor material from the IIIB and IVB Group of the Periodic Table suspended within said colloidal volume, wherein said nano-particles are selected to resonate with said light emitting diode wavelength photons providing a re-emitted photon at said light emitting diode wavelength;
        a plurality of quantum dots suspended within said colloidal volume lens and of selected size providing a selected one of a broadband emission with a range of substantially 420- 710 nm in response to incident light emitting diode photons and a monochromatic light emission; and
    a plurality of one of a micro and a nano transparent spheres of one of a glass polymer plastic disposed to scatter photons from said quantum dots within said volume, wherein said stationary colloidal suspension volume lens comprises a Gaussian curvilinear surface volume;
    and wherein said light emitting diode is disposed to release incident photons throughout said photon transparent epoxy and polymer plastic embodiment for quantum interaction with said quantum dots to establish one of a designed white colour temperature expressed in degrees Kelvin and a designed substantially single colour temperature expressed in degrees Kelvin.

2. The photon converter as recited in claim 1, comprising a selected ratio of red-to-green quantum dots, silicon nano-particles, and glass or polymer micro spheres are utilized to form a spectrum of desired emitted "white" light colour temperatures measured in degrees Kelvin from a light emitting diode.

3. The photon converter as recited in claim 1, wherein said plurality of quantum dots includes ultra small quantum dots of size diameter less than 2 nanometers, silicon nano-particles, and at least one of glass and polymer micro spheres are disposed within said stationary epoxy colloidal suspension volume lens and utilized to convert ultraviolet (~450 nm) incident photons from said light emitting diode to usable "white" light.

4. The photon converter as recited in claim 1, wherein said epoxy is utilized that has inherent characteristics of passing without attenuation throughout its volume, ultraviolet light of a spectrum associated with desired Stokes absorption to emission shift values inherent of said quantum dots.

5. The photon converter as recited in claim 1, wherein said lens stationary colloidal suspension volume is disposed over an array of a plurality of LED dies.

* * * * *